United States Patent [19]

Kamono et al.

[11] Patent Number: 4,593,463
[45] Date of Patent: Jun. 10, 1986

[54] METHOD OF MAKING A CONTACT ASSEMBLY

[75] Inventors: Takashi Kamono, Yokohama; Akihiko Otsu, Kawasaki, both of Japan

[73] Assignee: AMP Incorporated, Harrisburg, Pa.

[21] Appl. No.: 659,609

[22] Filed: Oct. 11, 1984

[30] Foreign Application Priority Data

Oct. 31, 1983 [JP] Japan ................................ 58-204616

[51] Int. Cl.⁴ ........................................... H01R 43/16
[52] U.S. Cl. .................................. 29/884; 339/276 SF
[58] Field of Search .................... 339/276 SF; 29/827, 29/841, 884

[56] References Cited

U.S. PATENT DOCUMENTS 3,252,206  5/1966  Stevens ................... 29/884
4,045,869  9/1977  Hartmann et al. ........ 29/884
4,388,757  6/1983  Takeyama et al. ......... 29/884 X
4,393,581  7/1983  Cherian ................. 29/827

Primary Examiner—Howard N. Goldberg
Assistant Examiner—Carl J. Arbes
Attorney, Agent, or Firm—Adrian J. LaRue

[57] ABSTRACT

An electrical connector for connecting electrode members of a chip carrier to circuit paths of a circuit board comprises a base housing having rows of aligned apertures extending through a bottom section of the housing. A contact assembly has electrical contacts which include spring contact portions for electrical engagement with respective electrode members of the chip carrier and inclined and aligned terminal portions in rows that are disposed in respective apertures for electrical connection with respective circuit paths of the circuit board and a depressing member on the base housing that depresses the electrode members of the chip carrier into wiping electrical contact with the contact portions.

2 Claims, 13 Drawing Figures

FIG. 1A

PRIOR ART

FIG. 1B

PRIOR ART

METHOD OF MAKING A CONTACT ASSEMBLY

FIELD OF THE INVENTION

The invention relates to an electrical connector and more particularly to an electrical connector for use to connect a leadless IC semiconductor chip onto a printed circuit board.

BACKGROUND OF THE INVENTION

Since electronic equipment is designed to be smaller, lighter, of higher performance, less expensive and of higher reliability, active passive elements constituting electronic circuits of electronic equipment are accordingly required to also be smaller.

Recently, leadless high density IC semiconductor chips to meet the above requirements have been used in electronic circuits of various electronic equipment.

In the IC semiconductor chip mentioned above, each element formed therein is directly connected to a printed circuit board through a special electrical connector, not by wire bonding or the like, using very fine metallic wires.

The electrical connector has in its housing electrical contacts which correspond to a conductive electrode pattern on an insulating carrier substrate onto which the IC semiconductor chip is mounted and carried, the contact sections of the contacts being pressed in electrical contact with the electrode pattern, and, at the same time, terminal sections of the contacts extend to the exterior of the housing so that they are connected to conductive paths of a printed circuit, etched circuit, or multilayer board or the like.

Generally, the distance between the electrodes formed on an IC semiconductor chip carrier is so small that it is difficult to connect the electrodes to a printed circuit board with sufficient isolation between each other, therefore, conversion of pitch of the contacts is essential to expand the connection pitch by spacing the contacts between the IC chip carrier and the printed circuit board.

Figure 1A:
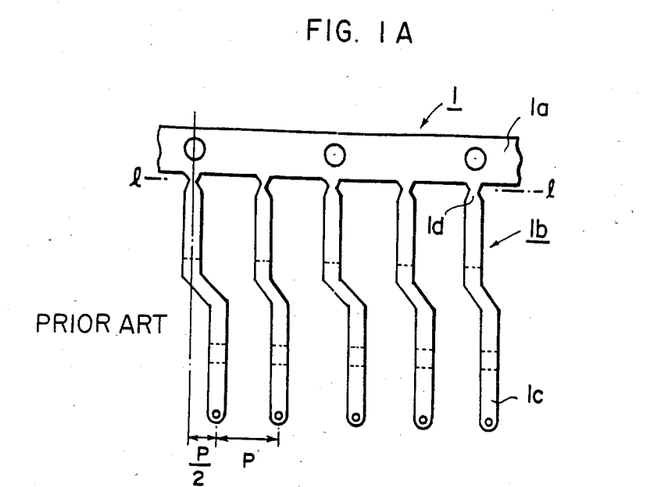
FIGS. 1A and 1B are part plan views of the prior art lead frames for forming two types of pitch-changing contacts.
Figure 1B:
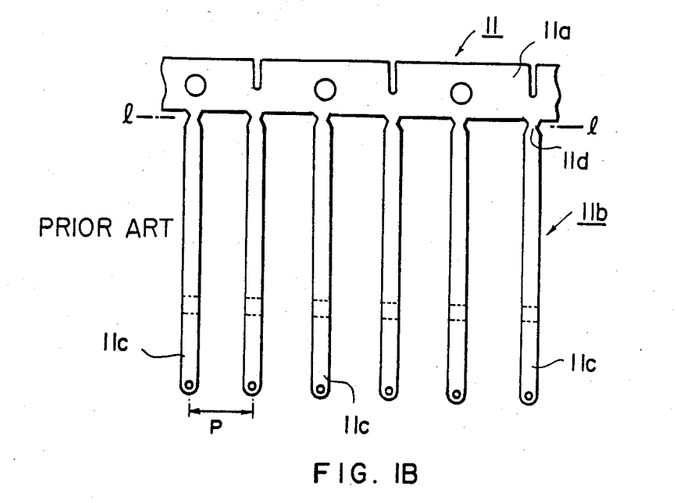

For this purpose, two types of conventional pitch-changing contacts are presently known, such as shown in FIGS. 1A and 1B. Both are formed from lead frames 1, 11. The shapes of contacts 1b, 11b, which project perpendicularly from the carrier strips 1a, 11a of the lead frames 1, 11, are changed in such a manner that the contact portions 1c are offset from the positions of contact portions 11c by one half of the pitch P which is respectively the pitch of the contacts 1b, 11b, the series of contacts being formed by bending each contact portion at its dotted line position. These two types of contacts are arranged in such a way that each of the contact portions 1c of FIG. 1A is centrally positioned between two adjacent contact portions 11c of FIG. 1B in the same plane, and also the contact portions 1d and 11d are sheared or cut from carrier strips 1a, 11a of lead frames 1, 11 along the lines 1—1 so that they are positioned parallel in two rows respectively and are spaced a distance P between contact portions 1d or 11d. Thus, the spacing between contact portions 1d or 11d is twice the distance between contact portions 1c, 11c combined (½P). According to this arrangement, attachment of contact portions 1d, 11d to a printed circuit board (not shown) is made relatively easier by expanding the pitch of contact portion 1d or 11d by twice the pitch of contact portions 1c, 11c combined.

However, the pitch-changing contacts heretofore described and illustrated have the following disadvantages:

(1) Two types of pitch-changing contacts must be separately formed and secured to a housing by pressing-in, thermal crimping, etc., so that the height of the contact portions varies, especially due to the dimensional tolerance of insertion holes for the contacts provided on the housing, and consequently, the resulting contact pressure between the contact portions and conductive electrode pattern varies and possibly results in adverse effects on the electrical and mechanical characteristics of an electrical connector.

(2) Since two types of pitch-changing contacts are necessary, separate lead frames must be used respectively for them so that material for stamping and forming into predetermined shapes is wasteful, resulting in higher product cost.

(3) Use of two types of small pitch-changing contacts makes assembly operation inefficient and more costly.

SUMMARY OF THE INVENTION

The present invention overcomes the foregoing disadvantages and has as an object to provide an electrical connector wherein pitch-changing electrical contacts are formed from a single lead frame and are secured adjacent to the middle portion of the contacts by molding the contacts in a dielectric frame member, thereby preventing the height of contact portions from varying and also making assembly operation substantially easier.

According to the present invention, an electrical connector comprises pitch-changing electrical contact assemblies having a dielectric member in which a plurality of electrical contacts with an equal pitch are secured, a base housing formed with apertures in which terminal portions of the contacts are inserted and which supports the contact assemblies, a support housing which is housed in the base housing and has the dielectric members of the pitch-changing contact assemblies clamped thereto, an upper housing for latchably securing the support housing in the base housing, a dielectric carrier substrate onto which is connected an IC semiconductor chip, the chip carrier substrate being positioned on the support housing and having an electro-conductive electrode pattern which is in electrical contact with contact portions of the pitch-changing contact assemblies, and a depressing member which depresses the chip carrier substrate so that the contact portions are wipingly and springably connected with the electrode pattern of the chip carrier substrate.

DETAILED DESCRIPTION OF THE INVENTION

Figure 11A:
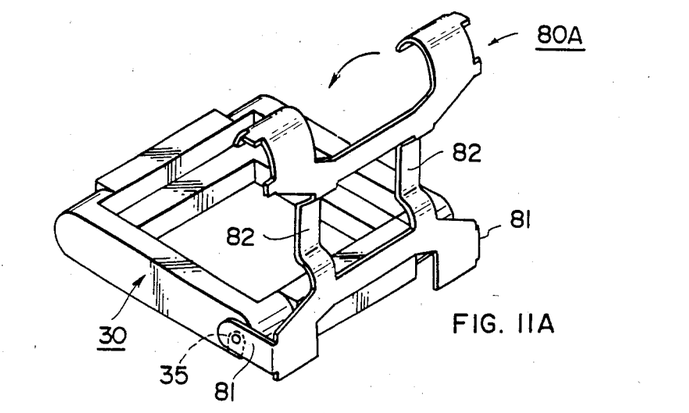
FIGS. 11A and 11B are perspective views showing respectively two examples of depressing clamps.
Figure 11B:
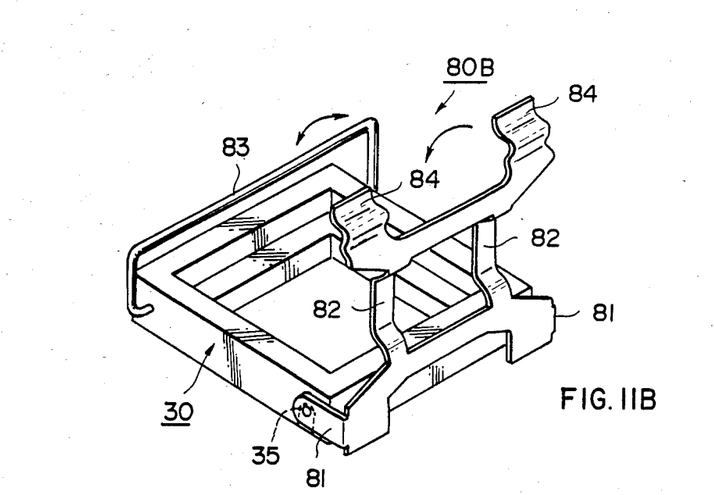

In the drawings, an electrical connector 100 comprises pitch-changing contact assemblies 20, a base housing 30 molded from a suitable dielectric material, a support housing 40 molded from a suitable dielectric material which is housed in base housing 30 and carries pitch-changing contact assemblies 20, an upper housing 50 provided above support housing 40 for securing support housing 40 in base housing 30, a dielectric substrate 60 which is a chip carrier for connection to and supporting a conventional IC semiconductor chip (not shown), chip carrier 60 being installed on support housing 40 and having an electroconductive electrode pattern (not shown) which is pressed in electrical contact with the respective electrical contacts of pitch-changing contact assemblies 20, and a depressing means of the type shown in FIGS. 11A and 11B which depresses dielectric substrate 60 onto contact assemblies 20.

Figure 3:
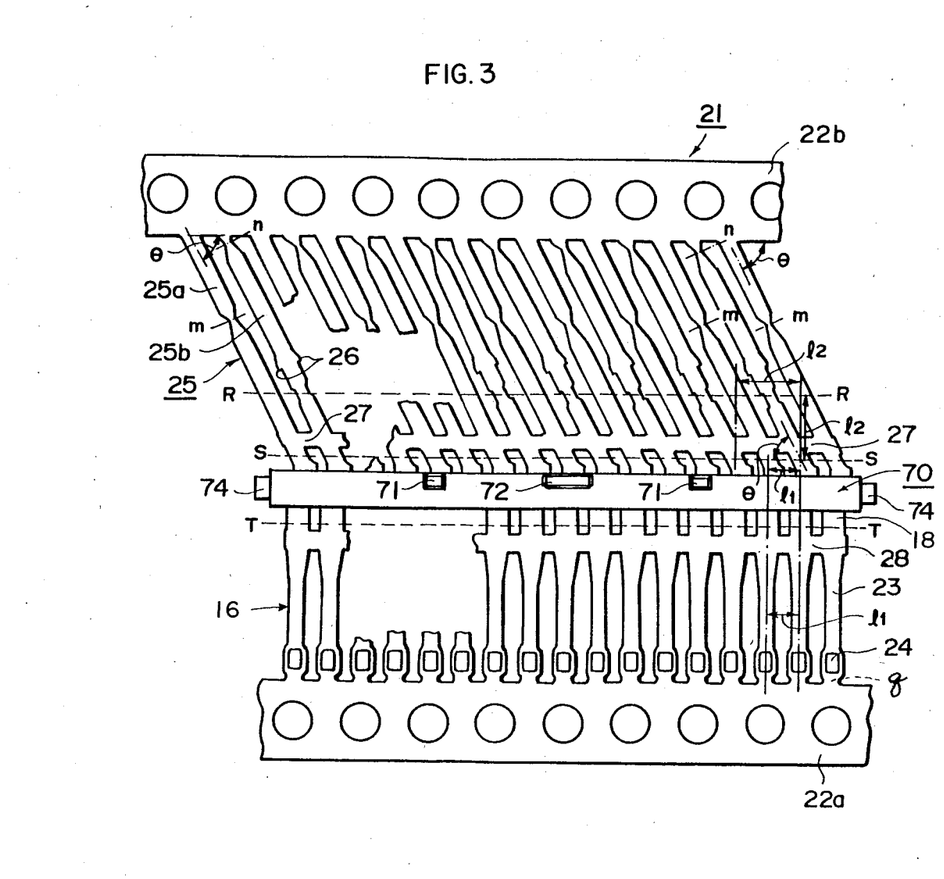
FIG. 3 is a part plan view of a lead frame for forming pitch-changing contacts to be used in the connector in FIG. 2.
Figure 4:
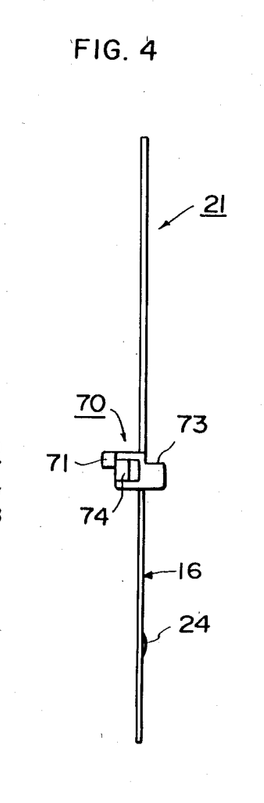
FIG. 4 is a side elevational view of the lead frame in FIG. 3.

The pitch-changing contact assemblies 20 are formed in accordance with the following description. As shown in FIGS. 3 and 4, contact portions 23 of electrical contacts 16 having a constant pitch in the lengthwise direction of a stamped and formed lead frame 21 are formed extending perpendicularly from one carrier strip 22a of two carrier strips 22a, 22b which are provided at opposite ends of lead frame 21. Contact portions 23 are provided respectively with a contact dimple 24 at the position adjacent to carrier strip 22a.

From carrier strip 22b extend terminal portions 25 which have the same constant pitch as the contact portions 23 with a predetermined angle to carrier strip 22b. The terminal portions 25 and the contact portions 23 are interconnected to each other via intermediate portions 18 forming contacts 16 and they are secured in dielectric member 70 preferably by molding to intermediate portions 18. Dielectric member 70 extends lengthwise of lead frame 21 and has secured therein a predetermined number of contacts 16. Small and large projections 71, 72 are located on the upper surface of member 70, a projecting ridge 73 extends along a bottom surface of member 70 and projections 74, 74 are located respectively at each end thereof.

Projections 71, 72, projecting ridge 73 and engaging projections 74, 74 are for engaging the support housing 40 as will be described later.

Terminal portions 25 are arranged alternately in the lengthwise direction of lead frame 21, terminal portions 25a, 25b being of different shapes which are subsequently removed from carrier strip 22b respectively along the cutting lines m, n. Terminal portions 25b are respectively provided with a pair of barbs 26, 26 at about middle positions thereof. Terminal portions 25a, 25b are interconnected to each other by a tie-bar 27 as well as the contact portions 23 by a tie-bar 28, but tie-bars 27, 28 are later removed to form separate terminal portions 25a, 25b as well as individual contact portions 23.

The inclination angle $\theta$ of terminal portions is determined by the following formula: $\theta = \tan^{-1} l_2/l_1 \ldots$ (1) where $l_1$ = pitch of contact portions 23, and $l_2$ = pitch between terminal portions 25a, 25a or between terminal portions 25b, 25b.

In the embodiment of the invention, it is assumed $l_1 = 1.27$ mm and $l_2 = 2.54$ mm. Substituting these values in formula (1), $\theta = 26.5651°$.

Naturally, inclination angle $\theta$ varies depending on the pitch conversion factor between the pitch $l_1$ of contact portions 23 and pitch $l_2$ of terminal portions 25a, 25b.

Figure 5:
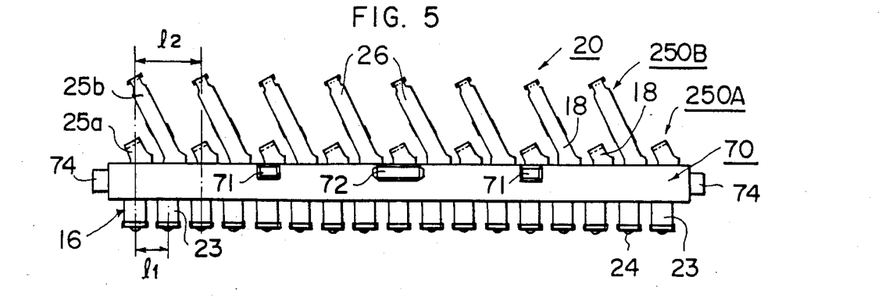
FIG. 5 is a top plan view of a pitch-changing contact assembly.
Figure 6:
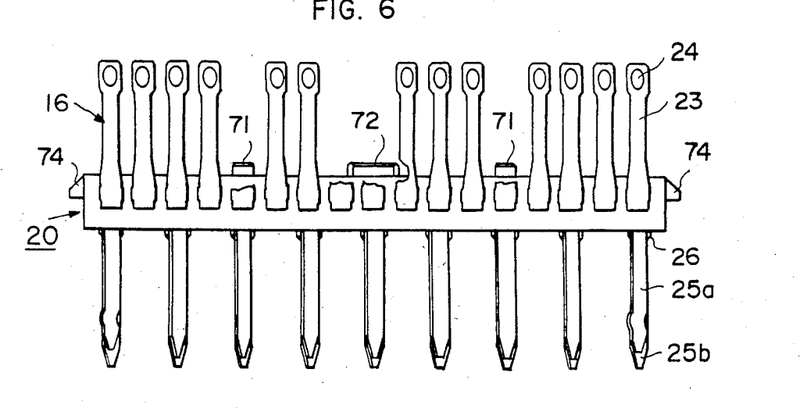
FIG. 6 is a side elevational view of the pitch-changing contact assembly in FIG. 5.
Figure 7:
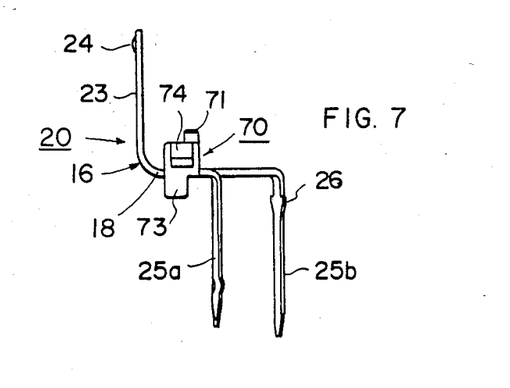
FIG. 7 is a side elevational view of the pitch-changing contact assembly in FIG. 5.

After members 70 have been molded to the series of contacts 16, lead frame 21 is subjected to a cutting operation along the cutting lines m, n in terminal portions 25a, 25b, along the cutting line q in contact portions 23, and tie-bars 27, 28 are removed, each contact and terminal portion is then bent to form pitch-changing contact assemblies 20 of the configuration shown in FIGS. 5 through 7.

Each portion is bent perpendicularly to the respective intermediate portion 18 of contacts 16, contact portions 23 being arcuately bent upwards and terminal portions 25a and 25b being bent at a right angle downwardly. Thus, terminal portions 25a and 25b are formed in two parallel rows, namely the first terminal group 205A being formed adjacent to member 70 and second terminal group 250B being formed at the locations spaced outwardly further than terminal group 250A from member 70.

Figure 2:
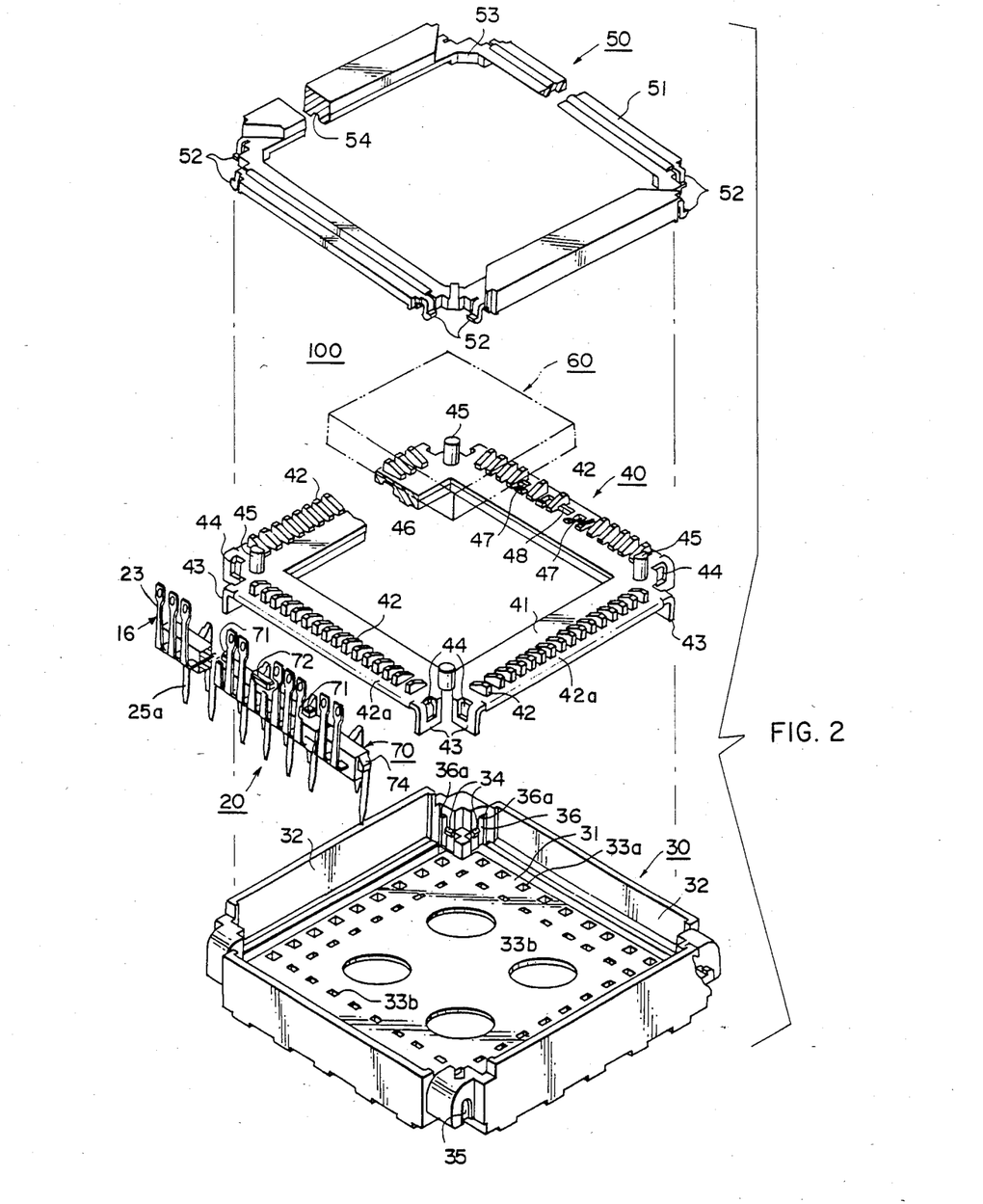
FIG. 2 is a perspective exploded view of the components of an electrical connector according to the invention.

The base housing 30 in which first and second terminal groups 250A and 250B are inserted is formed in a box shape which has a bottom section 31 and side sections 32, wherein two rows of aligned apertures 33a, 33b, into which the first and second terminal groups 250A, 250B are inserted, are provided along the circumference of bottom section 31.

At each corner of the internal wall surfaces of base housing 30, projections 34 are provided, and at each of a pair of adjoining corners on the outer surface of base housing 30, a slot 35 is provided to pivotably support a clamp to be described later.

Figure 8:
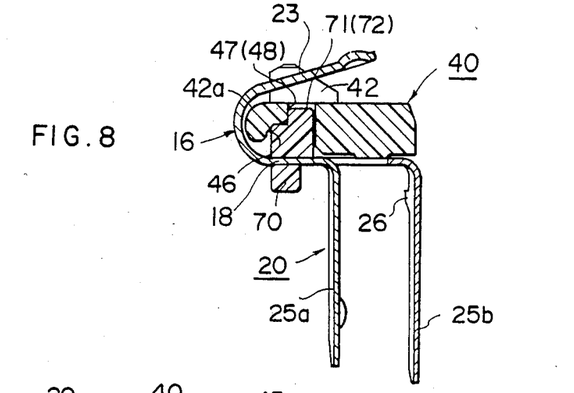
FIG. 8 is a cross-sectional view of the support housing in which the pitch-changing contact assembly is secured.
Figure 9:
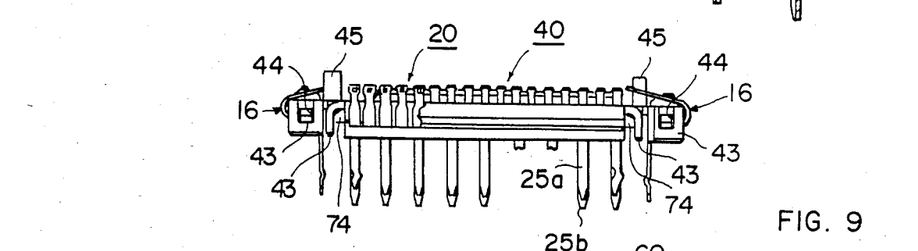
FIG. 9 is a side elevational view, partly broken away, of the support housing in FIG. 8.
Figure 10:
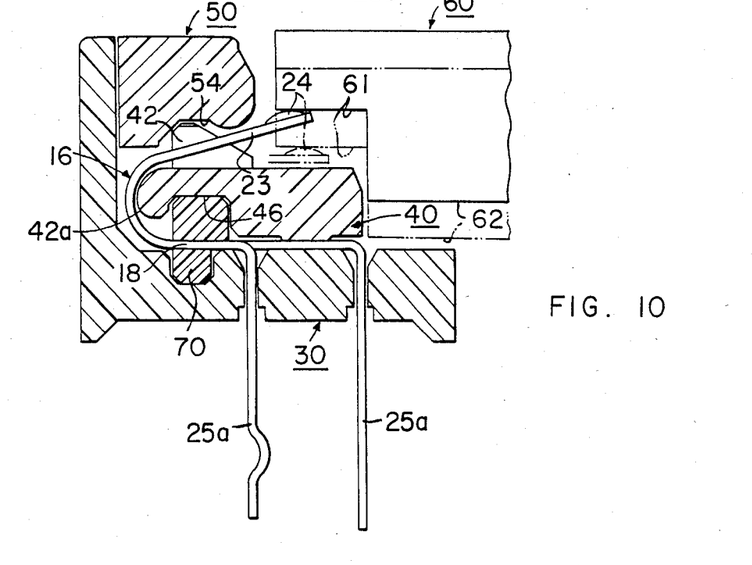
FIG. 10 is a part cross-sectional enlarged view showing the electrical connector of the present invention in an assembled condition.

Support housing 40, which is housed in base housing 30 and supports the pitch-changing contact assemblies 20, is constructed in the form of a square hollow frame 41 as shown in FIG. 2 and is provided with locating projections 42 on its upper surface along the periphery thereof, projections 42 being disposed at equally spaced locations to receive therebetween respective contact portions 23 of pitch-changing contact assemblies 20 which are bent over arcuate surfaces 42a of housing 40 in an arcuate configuration as shown in FIGS. 8 through 10. At each corner of hollow frame 41, integral flexible clamping members 43 are provided, each of which is formed with aperture 44 which engages a respective projection 34 of base housing 30. Also on the upper surface of each corner portion of hollow frame 41 is provided a pin 45 for locating upper housing 50 on housing 40.

The underside of hollow frame 41 beneath arcuate surfaces 42 is formed with circumferential slots 46 as shown in FIGS. 8 and 10, each of which is in alignment with apertures 44, 44 of opposing clamping members 43, 43 at both ends of each side of frame 41. At a plurality of positions along slots 46 are provided small holes 47, 48 into which fit projections 71, 72 provided on members 70 of pitch-changing contact assemblies 20.

Support housing 40 and pitch-changing contact assemblies 20 having the constructions heretofore described are assembled together forming a contact assembly before they are placed in base housing 30.

As shown in FIG. 8, contact portions 23 of pitch-changing contact assemblies 20 are bent over at a predetermined angle along arcuate surfaces 42a of hollow frame 41 constituting the support housing 40, and they are respectively inserted in the spaces between locating projections 42 formed on the upper surface of hollow frame 41. In this case, the angle at which contact portions 23 are bent is determined in order to maintain proper electrical contact between contact portions 23 and the electroconductive electrode pattern formed on chip carrier 60 to which is electrically connected the IC semiconductor chip. Various tests conducted on the embodiment of the invention indicated that the bending angle of about 15° relative to the horizontal plane is the most suitable.

Members 70 are disposed along respective slots 46 of support housing 40, and projections 71, 72 provided thereon are disposed in small holes 47, 48 provided in slots 46 of frame 41. Projections 74, 74 on the opposite ends of members 70 are inserted into respective aligned apertures 44, 44 of opposing clamping members 43, 43. Pitch-changing contact assemblies 20 are thus secured to support housing 40 thereby forming a contact assembly as shown in FIG. 9.

The contact assembly of FIG. 9 is encased and secured in base housing 30, wherein first terminal group 250A and second terminal group 250B of contact assemblies 20 are respectively inserted into the two rows of aligned apertures 33a, 33b provided in bottom section 31 of base housing 30.

When second terminal group 250B is inserted in apertures 33b, barbs 26 formed on each terminal portion 25b move along the walls of each aperture 33b resisting further insertion of the terminal portion 25b therein; however, since the first terminal group 250A and second terminal group 250B are formed in planes inclined $\theta°$ to the lengthwise edge of members 70, the edges of each terminal portion 25b are forcibly twisted by the walls of apertures 33b when the terminal group 250B is forced along respective apertures 33b, thereby enabling barbs 26 to pass through apertures 33b and engage the outer surface of section 31 of housing 30. Terminal portions 25b of group 250B then return to their original orientation due to the spring characteristics of the metal thereby providing means for preventing the second terminal group 250B from disengaging from housing 30.

Thus, no particular means for preventing disengagement of first terminal group 250A is therefore needed, but this is because such means is provided only on first terminal group 250B which is enough for preventing disengagement from housing 30 since the two terminal groups 250A, 250B are secured in member 70.

After the first and second terminal groups 250A and 250B are secured in housing 30, apertures 44 provided in the clamping members 43 of support housing 40 also receive projections 34 of base housing 30, thus completing attachment of support housing 40 onto base housing 30.

A dielectric substrate 60 to which an IC semiconductor chip is connected is positioned in a chip carrier receiving area on support housing 40, as shown in FIG. 10, so that on each flanged peripheral section 61 of dielectric substrate 60 is formed an electroconductive electrode pattern (not shown) which is connected to conductive pads of the IC semiconductor chip (not shown) attached to central portion 62 of substrate 60, the dielectric substrate 60 being positioned on support housing 40 so that each electrode of the electrode pattern makes contact with a respective contact dimple 24 of contact portions 23.

Upper housing 50 is in the form of a square hollow frame 51, each corner of which is provided with integral flexible latching members 52 and with sections 53 on its inside surface for contacting respective locating pins 45 of support housing 40 to locate housings 40 and 50 relative to each other.

U-shaped grooves 54 extend along the bottom surface of hollow frame 51 for receiving locating projections 42 of the support housing 40, as shown in FIG. 10.

Upper housing 50 is placed over support housing 40, and its latching members 52 engage upper surfaces 36a of slots 36 formed on the inner surfaces of the corners of base hosing 30, as shown in FIG. 2, thereby securing housing 50 to base housing 30.

Upper housing 50 and support housing 40 are housed in base housing 30, wherein the lower part of each aperture 44 of support housing 40 engages each projection 34 of base housing 30; thus, top housing 50, support housing 40 and base housing 30 are latchably and clampingly assembled together.

Dielectric substrate 60 supporting an IC semiconductor chip is depressed downwards by a depressing means so that the electrode pattern contacts the pitch-changing contact assemblies 20 with proper contact pressure, wherein a clamp such as shown in FIGS. 11A and 11B is used as the depressing means. Clamp 80A shown in FIG. 11A has on one end a pair of legs 81, 81 each of which pivotably engages pivot slot 35 at one end of base housing 30, wherein the other end of clamp 80A has resilient arcuate latching arms which resiliently engage corresponding arcuate surfaces at the opposite end of base housing 30. Sections 82, 82 of clamp 80A engage substrate 60 when the arcuate latching arms of clamp 80A are latchably engaging the arcuate surfaces of housing 30 thereby pressing the electrodes of substrate 60 into sliding electrical contact with respective contact dimples 24 of spring contact portions 23.

Clamp 80B, as shown in FIG. 11B, includes a clip 83 pivotally mounted at the opposite end of base housing 30 from clamp 80B for engaging upturned ends 84 of clamp 80B. The operation of clamp 80B is the same as clamp 80A.

An electrical connector for connecting electrode members of a chip carrier to circuit paths of a circuit board is disclosed which comprises a base housing having electrode portions of a contact assembly extending through a bottom section of the base housing in parallel rows and contact portions of the contact assembly bent over a chip carrier receiving area for electrical contact with respective electrode members on the chip carrier and a depressing member for depressing the chip carrier so that the contact portions remain in electrical contact with the respective electrode members, the electrode portions in one of the parallel rows being in alignment with respective electrode portions in the other of the parallel rows so that the spacing between the aligned electrode portions is twice that of the spacing between the contact portions.

We claim:

1. A method of making a contact assembly comprising the steps of:

stamping and forming a lead frame of electrical contact members from a blank strip of metal having contact portions, intermediate portions and terminal portions, the contact portions extending outwardly from a first carrier strip in a normal direction thereto and the terminal portions extending outwardly from a second carrier strip at an angle thereto;

molding a dielectric member to said intermediate portions; cutting the contact portions and the terminal portions from the carrier strips; and bending the contact portions at a substantially right angle in one direction and bending the terminal portions at a right angle in a direction opposite to the one direction.

2. A method according to claim 1, wherein the terminal portions are disposed in parallel rows with the terminal portions in the first row being in alignment with respective terminal portions in the second row so that the spacing between the aligned terminal portions is twice the spacing between the contact portions.

* * * * *